US007066641B2

(12) United States Patent
Honda

(10) Patent No.: US 7,066,641 B2
(45) Date of Patent: Jun. 27, 2006

(54) MICROMIXER

(75) Inventor: Nobuaki Honda, Tokyo (JP)

(73) Assignee: Yamatake Corporation, Tokyo (JP)

( * ) Notice: Subject to any disclaimer, the term of this patent is extended or adjusted under 35 U.S.C. 154(b) by 239 days.

(21) Appl. No.: 10/477,577

(22) PCT Filed: May 24, 2002

(86) PCT No.: PCT/JP02/05064

§ 371 (c)(1),
(2), (4) Date: Nov. 12, 2003

(87) PCT Pub. No.: WO02/096543

PCT Pub. Date: Dec. 5, 2002

(65) Prior Publication Data

US 2004/0145967 A1 Jul. 29, 2004

(30) Foreign Application Priority Data

May 28, 2001 (JP) ............................ 2001-158632

(51) Int. Cl.
*B81B 1/00* (2006.01)
*B01F 5/00* (2006.01)

(52) U.S. Cl. ................................ 366/340; 366/DIG. 3

(58) Field of Classification Search ............ 366/176.1, 366/181.5, 336, 341, DIG. 1, DIG. 2, DIG. 3; 48/189.4; 336/340
See application file for complete search history.

(56) References Cited

U.S. PATENT DOCUMENTS

| | | | | |
|---|---|---|---|---|
| 1,409,259 | A * | 3/1922 | Sykora | 239/565 |
| 3,856,270 | A * | 12/1974 | Hemker | 366/340 |
| 4,537,217 | A * | 8/1985 | Allen, Jr. | 137/561 A |
| 4,550,681 | A * | 11/1985 | Zimmer et al. | 118/410 |
| 4,869,849 | A * | 9/1989 | Hirose et al. | 261/78.2 |
| 5,137,369 | A * | 8/1992 | Hodan | 366/340 |
| 5,595,712 | A * | 1/1997 | Harbster et al. | 422/129 |

(Continued)

FOREIGN PATENT DOCUMENTS

| | | | |
|---|---|---|---|
| DE | 19927556 | A1 * | 12/2000 |
| EP | 1123735 | A2 * | 8/2005 |

(Continued)

*Primary Examiner*—Charles E. Cooley
(74) *Attorney, Agent, or Firm*—Frishauf, Holtz, Goodman & Chick, P.C.

(57) ABSTRACT

A micro-mixer of a simple structure suited to form a micro-mixed liquid from two kinds of liquids A and B comprises a plurality of passage modules 7 stacked and thereby forming a multi-tiered flow passage. Each of the passage modules has a plurality of combining-dividing units 10 arranged at regular intervals. Each of the combining-dividing units has two inlets 11*a*, 11*b* and two outlets 12*a*, 12*b*. The two outlets 12*a*, 12*b* of each of the combining-dividing units in each of the stacked passage modules are connected with an inlet 11*a* of a combining-dividing unit and an inlet 11*b* of another combining-dividing unit in its immediate downstream passage module, respectively.

8 Claims, 7 Drawing Sheets

U.S. PATENT DOCUMENTS

| | | | | |
|---|---|---|---|---|
| 5,783,129 | A * | 7/1998 | Shirai et al. | 264/136 |
| 5,961,932 | A * | 10/1999 | Ghosh et al. | 422/193 |
| 5,984,519 | A * | 11/1999 | Onodera et al. | 366/340 |
| 5,992,453 | A * | 11/1999 | Zimmer | 137/561 A |
| 6,299,657 | B1 * | 10/2001 | Schubert et al. | 48/197 FM |
| 6,616,327 | B1 * | 9/2003 | Kearney et al. | 366/340 |
| 6,890,093 | B1 * | 5/2005 | Karp et al. | 366/336 |
| 6,935,772 | B1 * | 8/2005 | Karp et al. | 366/341 |
| 2002/0097633 | A1 * | 7/2002 | O'Connor et al. | 366/336 |
| 2003/0039169 | A1 * | 2/2003 | Ehrfeld et al. | 366/336 |
| 2004/0145967 | A1 * | 7/2004 | Honda | 366/336 |

FOREIGN PATENT DOCUMENTS

| | | | |
|---|---|---|---|
| JP | 2-34653 | B2 | 8/1990 |
| JP | 5-13391 | Y2 | 4/1993 |
| JP | 2005-131503 | * | 5/2005 |

* cited by examiner

MICROMIXER

This application is a U.S. National Phase Application under 35 USC 371 of International Application PCT/JP02/05064 filed May 24, 2002.

TECHNICAL FIELD

The invention relates to a micro-mixer which exhibits high mixing performance, is easy to produce, and has a simple structure.

BACKGROUND ART

A micro-mixer is produced, for example, by machining a semiconductor substrate of Si or the like employing a micro-machining technique.

In a micro-mixer of this type, for example, two kinds of liquids (fluids) A, B are combined to form a two-layer laminar flow (A+B), and then the laminar flow (A+B) is divided into two half-flows (A+B)/2 along the direction of the laminar flow. Then, two half-flows (A/2+B/2) are combined to form a four-layer laminar flow (A/2+B/2+A/2+B/2), and then this laminar flow is divided in two along the direction of the laminar flow. By repeating combining of laminar flows and dividing of a laminar flow along its direction this way, the liquids A, B are gradually divided into smaller layers, so that the liquids A, B are diffused faster.

However, in conventional micro-mixers, passages for combining and dividing fluids (liquids) are minute and require high production accuracy. Hence, the method of machining (producing) them is complicated. Further, accurate alignment is required, which leads to high production cost. Further, since the passages are minute, they easily become clogged with liquid particles when they have complicated passage structure. Clogging occurs easily especially at narrow slits provided for dividing fluids. Another problem is that flows of fluids become uneven, which makes it difficult to obtain the required mixing performance.

DISCLOSURE OF THE INVENTION

An object of the invention is to provide a micro-mixer which does not become clogged with liquid particles, exhibits high mixing performance, is easy to produce, and has a simple structure.

In order to achieve the above object, a micro-mixer according to the invention comprises a plurality of passage modules stacked and thereby forming a multi-tiered flow passage, each of the passage modules having a plurality of combining-dividing units arranged at regular intervals, each of the combining-dividing units having n (favorably, n=2 to 4) number of inlets and n number of outlets.

In a specific mode, in each of the stacked passage modules, the n number of inlets of each of the combining-dividing units are formed in an upstream surface of the passage module, the n number of outlets of each of the combining-dividing units are formed in an downstream surface of the passage module, and the n number of inlets and the n number of outlets of each of the combining-dividing units are connected by a channel. The n number of outlets of each of the combining-dividing units in each of the stacked passage modules are each connected with an inlet of a different one of n number of combining-dividing units in the passage module which forms the next tier.

In other words, according to the invention, a micro-mixer of a multi-tiered structure is formed by stacking a plurality of plate-like passage modules each having an arrangement of a plurality of combining-dividing units. Each of the combining-dividing units has n number of inlets formed in the upstream surface of the passage module and n number of outlets formed in the downstream surface of the passage module, and these inlets and outlets are connected by a channel to form a passage. In a specific mode, the n number of outlets of each of the combining-dividing units in each of the stacked passage modules are each connected with an inlet of a different one of n number of combining-dividing units in its immediate downstream passage module. Thus, fluids flowing into each of the combining-dividing units through its n number of inlets are combined, and divided through its n number of outlets and flow out. The fluids flowing out through the n number of outlets each flow into an inlet of a different one of n number of combining-dividing units in the immediate downstream passage module.

In a favorable mode of the invention, the n which is the number of inlets and of outlets of each combining-dividing unit is 2, and in the combining-dividing units arranged in each of the passage modules, the distance between two adjacent outlets of two adjacent combining-dividing units is equal to the distance between the two inlets of each combining-dividing unit. More favorably, the combining-dividing units arranged in each of the passage modules in the above-described manner are arranged in a line.

In a favorable mode of the invention, in each of the combining-dividing units, the n number of inlets and the n number of outlets have an approximately equal diameter, and the channel has a width and a depth which are approximately equal to that diameter. The diameter of the outlets may be determined depending on the diameter of the inlets in the immediate downstream passage module with which they are connected.

When a multi-tiered flow passage for mixing fluids are formed in the above-described manner, it is favorable that the passage module which forms the most downstream tier has a collecting part for collecting fluids flowing from the outlets of the combining-dividing units thereof and making them flow into a single passage. It is especially favorable that the collecting part has a passage length which gives time required for the fluids flowing in from the outlets to mix. When reaction should occur between the fluids, it is favorable that the collecting part has a passage length which gives enough time for the reaction.

A specific micro-mixer according to the invention comprises a plurality of plate-like passage modules which are stacked, each of said passage modules having at least one combining-dividing and/or at least one combining unit, the combining-dividing unit having two inlets and two outlets connected by a channel, and the combining unit having two inlets and one outlet connected by a channel. The two inlets of each of the at least one combining-dividing and/or at least one combining unit in each of the stacked passage modules are each connected with an outlet of a different one of two of the at least one combining-dividing and/or at least one combining unit in its immediate upstream passage module. In the stacked passage modules, the number of the at least one combining-dividing and/or at least one combining unit included in one passage module is decreased one by one from the most upstream passage module to the most downstream passage module so that fluids will be mixed through the stacked passage modules and made to flow out into a single passage.

In this case, it is favorable that the combining-dividing unit has a structure in which an island-like partition for determining the direction of the channel is provided in the center of the structure, the two inlets are arranged symmetrically relatively to the partition, the two outlets are arranged symmetrically relatively to the partition, and the direction in which the two inlets are arranged and the direction in which the two outlets are arranged cross at right angles. Meanwhile, the combining unit has a structure such that one of the two outlets of the combining-dividing unit is omitted with a part of the channel which extends to the omitted outlet.

BEST MODE OF CARRYING OUT THE INVENTION

Figure 1:
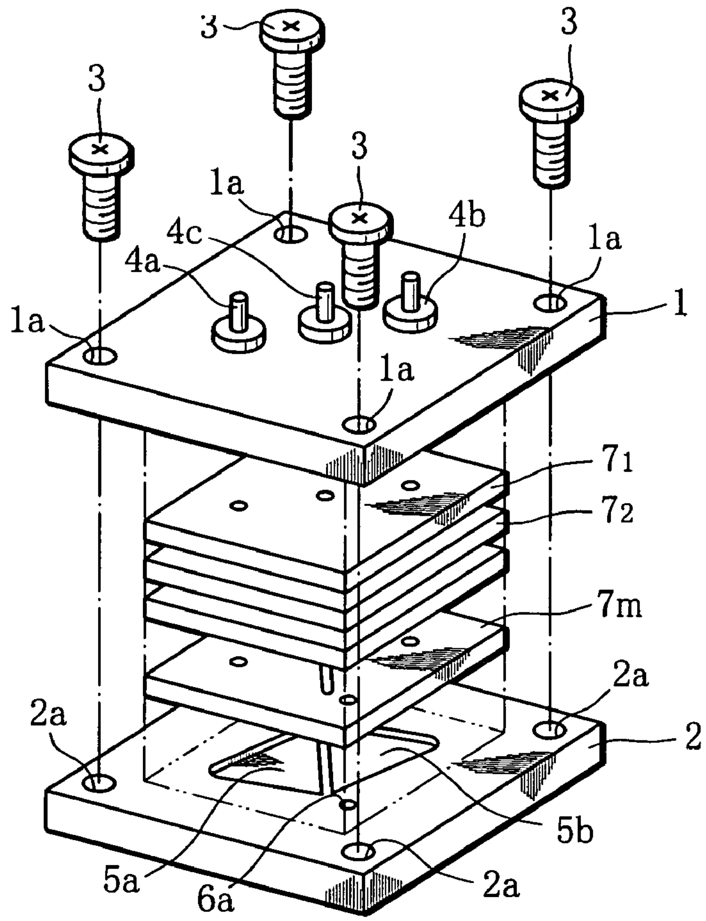
FIG. 1 is an exploded perspective view showing a schematic structure of a micro-mixer according to an embodiment of the invention.

Referring to the drawings, an embodiment of the invention will be described, using an example of a micro-mixer for mixing two kinds of liquids A and B, expediting their diffusion.

FIG. 1 is an exploded perspective view showing a schematic structure of a micro-mixer according to this embodiment, where reference numerals 1 and 2 denote upper and lower plates, respectively. The upper and lower plates 1, 2 are flat square-like plates of, for example, 5 mm in thickness and about 50 mm in length of one side, made of Al material, SUS or the like. The plate 1 has through-holes 1*a* at its four corners, while the plate 2 has screw holes 2*a* at its four corners. The plates 1 and 2 are combined together with a plurality of passage modules (described later) between them, by fastening four bolts 3 through the through-holes 1*a* in the upper plate 1 into the screw holes 2*a* in the lower plate 2.

Figure 2:
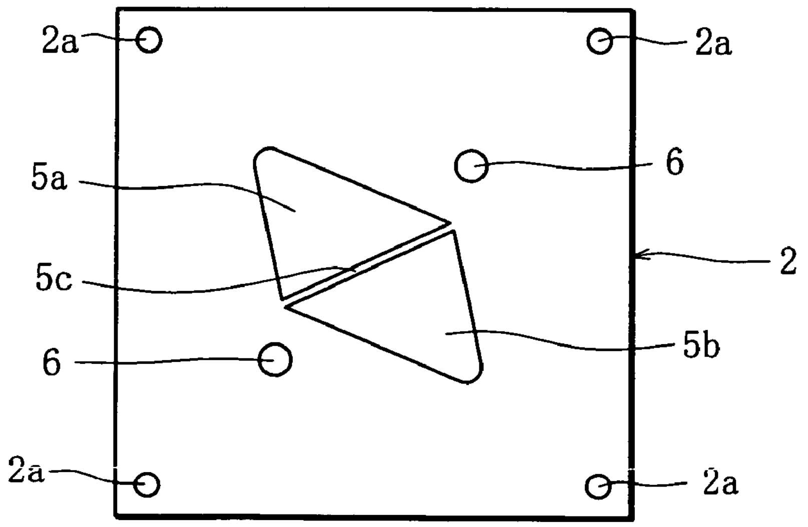
FIG. 2 is an illustration showing an arrangement of fluid flowing-in channels provided in a lower plate included in the micro-mixer shown in FIG. 1.

The upper plate 1 has three through-holes (not shown) in its central part, which are arranged in a diagonal direction. Connectors 4*a*, 4*b* for fluid flowing in and a connector 4*c* for fluid flowing out are fitted in these through-holes. As shown in FIG. 2, the lower plate 2 has fluid flowing-in channels 5*a*, 5*b* in its central part, which correspond to the two through-holes in which the connectors 4*a*, 4*b* for fluid flowing in are fitted, respectively. The fluid flowing-in channels 5*a*, 5*b* are approximately triangular in shape and have a predetermined depth. The fluid flowing-in channels 5*a*, 5*b* are separated from each other by a partition wall 5*c* of a predetermined thickness. The partition wall 5*c* extends along combining-dividing units arranged in a line in each passage module (described later). The lower plate 2 also has pin holes 6, in which guide pins (not shown) are vertically inserted. The guide pins inserted in the pin holes 6 are used as guides when a plurality of passage modules (described later) are stacked in position.

Figure 3:
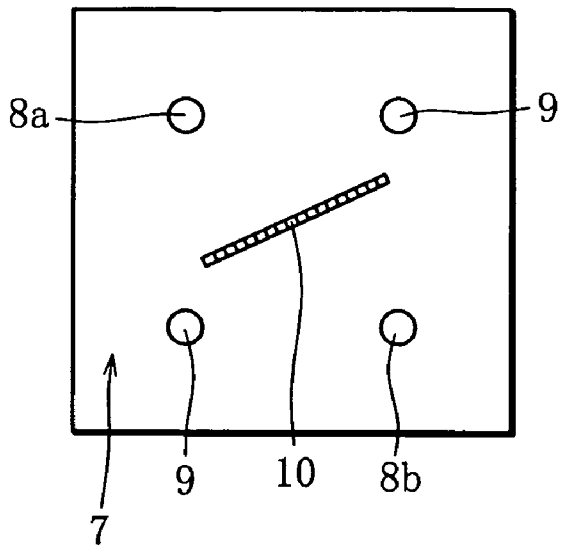
FIG. 3 is an illustration showing a schematic structure of one of passage modules included in the micro-mixer shown in FIG. 1.

A plurality (m number) of passage modules 7 ($7_1$, $7_2$ . . . $7_m$) stacked between the plates 1 and 2 are flat square-like plates of, for example, 0.8 mm in thickness and about 25 mm in length of one side, made of Al material, SUS or the like. As shown in FIG. 3, the passage modules 7 each have through-holes 8*a*, 8*b*, which correspond to the two through-holes in which the connectors 4*a*, 4*b* for fluid flowing in are fitted, respectively, and through-holes 9 through which the above-mentioned guide pins are inserted to put the passage module in position. Further, the passage modules 7 each have a plurality of combining-dividing units 10 arranged along the partition wall 5*c* which separates the fluid flowing-in channels 5*a*, 5*b*.

Figure 4:
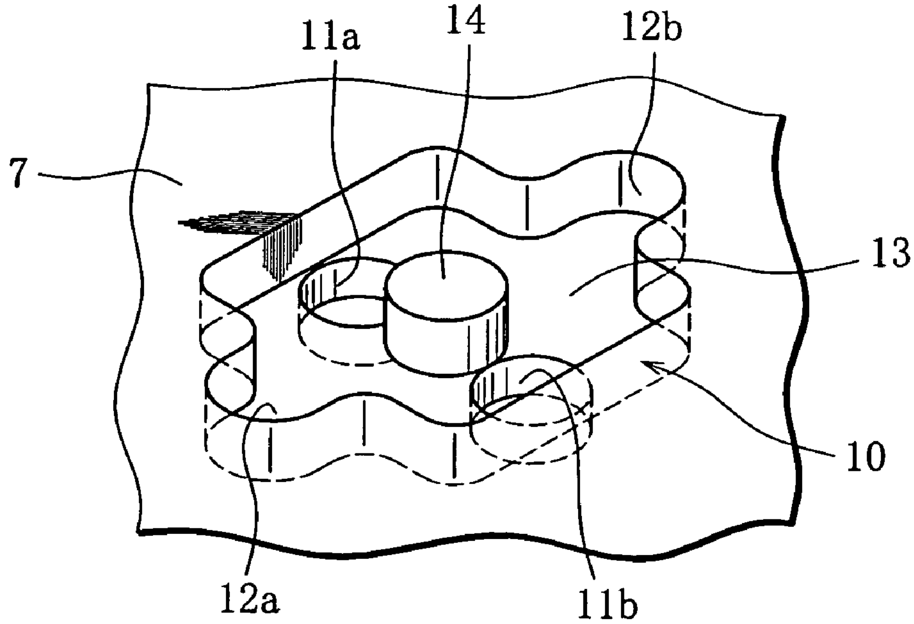
FIG. 4 is a partial perspective view showing a schematic structure of a combining-dividing unit included in a passage module.

For example, as schematically shown in FIG. 4, the combining-dividing unit 10 has two inlets 11 (11*a*, 11*b*) formed in the upstream surface (lower surface) of the plate-like passage module 7, and two outlets 12 (12*a*, 12*b*) formed in the downstream surface (upper surface) of the passage module 7. The inlets 11*a*, 11*b* and the outlets 12*a*, 12*b* are connected by a channel 13 which is formed in the upper surface with a depth of 0.4 mm. In this way, a passage connecting the upper and lower surfaces of the passage module 7 is formed in the combining-dividing unit 10.

In this particular combining-dividing unit 10, an island-like partition 14 for determining the direction of the channel 13 is provided in the center of the channel 13. The two inlets 11*a*, 11*b* are arranged symmetrically relatively to the partition 14, the two outlets 12*a*, 12*b* are arranged symmetrically relatively to the partition 14, and the direction in which the two inlets 11*a*, 11*b* are arranged and the direction in which the two outlets 12*a*, 12*b* are arranged cross at right angles. Further, in this combining-dividing unit 10, the diameter of the inlets 11*a*, 11*b*, the diameter of the outlets 12*a*, 12*b*, the width of the channel 13 and the depth of the channel 13 are the same size, for example, 0.4 mm. Further, the two inlets 11*a*, 11*b* are 0.4 mm apart, while the two outlets 12*a*, 12*b* are 1.2 mm apart.

M number of the passage modules 7 ($7_1$, $7_2$ . . . $7_m$) each have a plurality of combining-dividing units 10 of the above-described structure, which are arranged in a line at predetermined intervals. The passage modules 7 ($7_1$, $7_2$ . . . $7_m$) are stacked in order in such a manner that the outlets 12*a*, 12*b* of the combining-dividing units 10 in each passage module are connected with the inlets 11*a*, 11*b* of the combining-dividing units 10 in its immediate upper passage module. In this way, the passage modules 7 ($7_1$, $7_2$ . . . $7_m$) form a multi-tiered flow passage.

Specifically, in the passage modules 7 ($7_1$, $7_2$ . . . $7_m$), the two outlets 12*a*, 12*b* of each combining-dividing unit 10 in each passage module 7 are connected with an inlet 11*a* of a combining-dividing unit 10 and an inlet 11*b* of another combining-dividing unit 10 in its immediate downstream passage module 7, respectively. In other words, in the passage modules 7 ($7_1$, $7_2$ . . . $7_m$), the two inlets 11*a*, 11*b* of each combining-dividing unit 10 in each passage module 7 are connected with an outlet 12*a* of a combining-dividing unit 10 and an outlet 12*b* of another combining-dividing unit 10 in its immediate upstream passage module 7, respectively.

In the passage modules 7 ($7_1$, $7_2$ . . . $7_m$), each combining-dividing unit 10 in each passage module 7 receives, through its two inlets 11*a*, 11*b*, a fluid flowing from an outlet 12*a* of a combining-dividing unit 10 and a fluid flowing from an outlet 12*b* of another combining-dividing unit 10 in its immediate upstream (lower) passage module 7, and combine them. Then, the combining-dividing unit 10 divides the resulting mixed fluid through its two outlet 12*a*, 12*b*, and makes half of the mixed fluid flow into an inlet 11*a* of a combining-dividing unit 10 and the other half of the mixed fluid flow into an inlet 11*b* of another combining-dividing unit 10 in the immediate downstream (upper) passage module 7.

Figure 5:
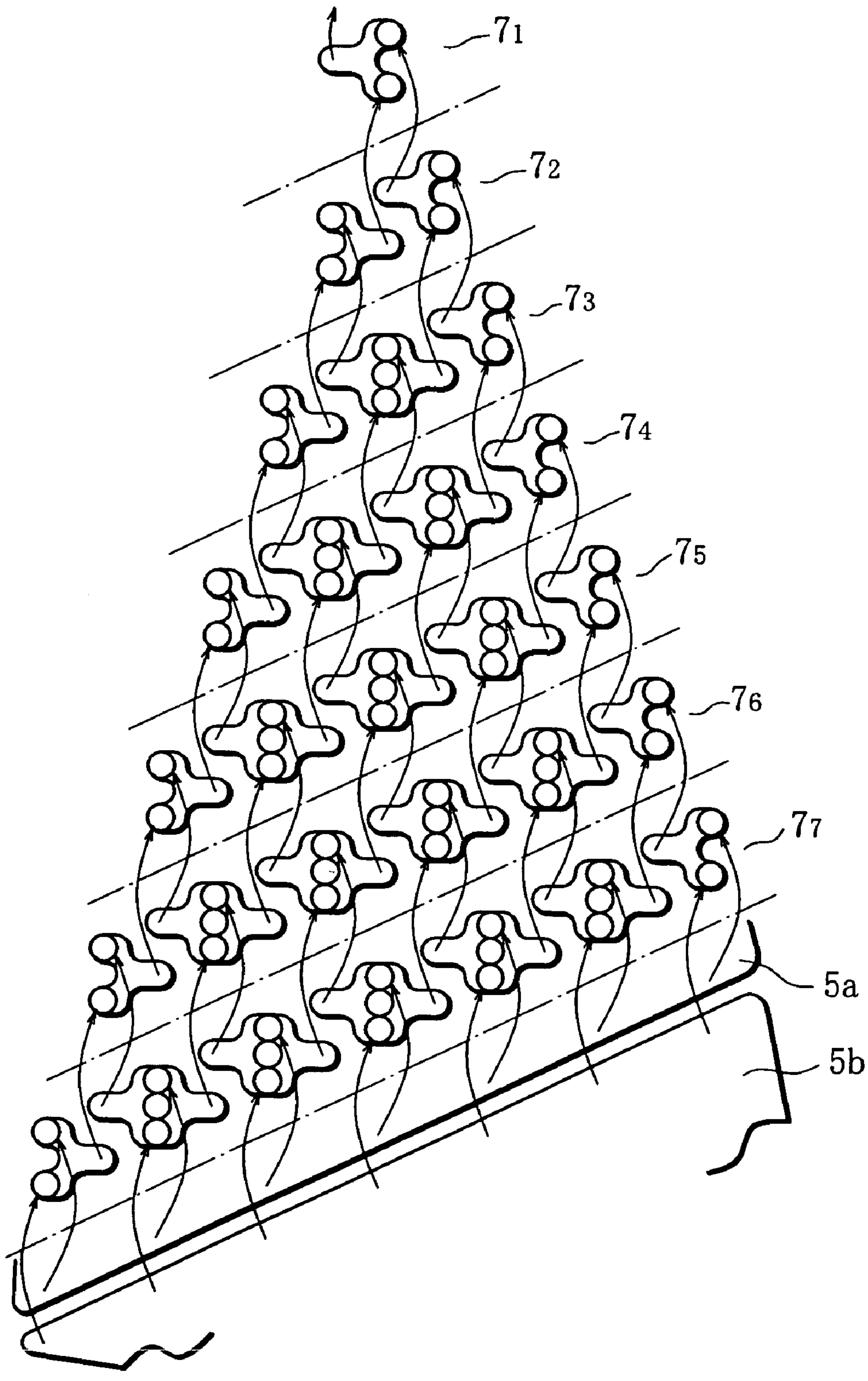
FIG. 5 is an illustration for explaining how the inlets and outlets of combining-dividing units included in passages modules are connected, and how fluids are combined and divided by the combining-dividing units.

Specifically, in the micro-mixer according to the present embodiment, in m number of the passage modules 7 ($7_1$, $7_2$ . . . $7_m$) the number of the combining-dividing units 10 included in one passage module increases one by one from a more downstream passage module to a more upstream passage module, as seen in FIG. 5 which shows an example of forming a seven-staged (seven-tiered) flow passage. More specifically, the uppermost passage module $7_1$ located most downstream has one combining-dividing unit 10. The number of the combining-dividing units 10 increases one by one from the second most downstream passage module $7_2$ to the most upstream passage module $7_7$. The lowermost passage module $7_7$ located most upstream has seven combining-dividing unit 10.

In this embodiment, in some positions, a combining unit 15 which can be considered as a special type of combining-dividing unit 10 is used in place of the combining-dividing unit 10 of the above-described structure. The combining unit 15 has a structure such that one of the two outlets 12*a*, 12*b* of the combining-dividing unit 10 of the structure shown in FIG. 4 is omitted with that part of the channel 13 which extends to the omitted outlet 12. Thus, the combining unit 15 does not have a function of dividing a mixed fluid. As will be explained later, the combining unit 15 is used where what is required is only to combine fluids flowing in through two inlets 11*a*, 11*b* and make the resulting mixed fluid flow into to a single combining-dividing unit 10 (combining unit 15) in an immediate downstream passing module $7_1$, $7_2$ . . . $7_6$.

In the stacked passage modules 7, the combining-dividing units 10 and combining units 15 are so arranged that an outlet 12*a* of a combining-dividing unit 10 (combining unit 15) and an outlet 12*b* of its adjacent combining-dividing unit 10 (combining unit 15) are each aligned with one of the two inlets 11*a*, 11*b* of an immediate downstream (upper) combining-dividing unit 10 (combining unit 15).

In other words, in the stacked passage modules 7, an outlet 11*a* of one of two adjacent combining-dividing units 10 (combining units 15) is aligned with an inlet 11*a* of an immediate downstream (upper) combining-dividing unit 10 (combining unit 15), while an outlet 11*b* of the other of the two combining-dividing units 10 (combining units 15) is aligned with the other inlet 11*b* of the immediate downstream (upper) combining-dividing unit 10 (combining unit 15). Thus, only by stacking m number of the passage modules 7 ($7_1$, $7_2$ . . . $7_m$) in position, the inlets 11*a*, 11*b* and the outlets 12*a*, 12*b* of the combining-dividing units 10 and combining units 15 of the passage modules, 7 are connected in the above-described relationship.

In the micro-mixer in which m number of the passage modules 7 ($7_1$, $7_2$ . . . $7_m$), each having a predetermined number of combining-dividing units 10 and/or combining units 15 arranged at predetermined intervals, are stacked, mixing of two kinds of fluids (liquids) A, B are carried out as follows:

As shown in FIG. 5, when two kinds of fluids (liquids) A, B are fed to the two fluid flowing-in channels 5*a*, 5*b* provided at the lower plate 2 at predetermined pressure, a fluid (liquid) A flows into each of the combining-dividing units 10 (combining units 15) of the most upstream (lowermost) passage module $7_m$ ($7_7$) through one 11*a* of its two inlets, while the other fluid (liquid) B flows into each of the combining-dividing units 10 (combining units 15) of the most upstream (lowermost) passage module 7*m* ($7_7$) through the other inlet 11*b*. The fluids (liquids) A, B are combined at the channel 13 of each of the combining-dividing units 10 (combining units 15), and divided through the two outlets 12*a*, 12*b* and flow out through them.

In the passage module 76 which forms the next stage, each of the combining-dividing units 10 (combining units 15) receives, through one 11*a* of its two inlets, a fluid (liquid) [A+B/2] flowing from one 12*a* of the two outlets of a combining-dividing unit 10 (combining unit 15) of the passage module $7_7$, as a fluid (liquid) Al to be combined next. Also, each of the combining-dividing units 10 (combining units 15) receives, through the other inlet 11*b*, a fluid (liquid) [A+B/2] flowing from the other outlet 12*b* of another combining-dividing unit 10 (combining unit 15) of the passage module 77, as a fluid (liquid) B1 to be combined with the fluid (liquid) A1. The fluids (liquids) A1, B1 are combined at the channel 13 of each of the combining-dividing units 10 (combining units 15), and divided through the two outlets 12*a*, 12*b* and flow out through them.

By repeating this way of combining of two fluids (liquids) and dividing the resulting mixed fluid through the passage modules 7 in order, micro-division (micro-mixing) of the original two kinds of fluids (liquids) A, B is carried out. From the most downstream (uppermost) passage module $7_1$, a micro-mixed liquid in which the original two liquids A, B are mixed, or diffused evenly is taken out.

Hence, in the micro-mixer according to the present embodiment, a micro-mixed liquid in which two kinds of liquids A, B are mixed can be formed quickly and effectively only with a simple structure in which a plurality of plate-like passage modules 7 ($7_1$, $7_2$ . . . $7_m$) having a plurality of combining-dividing units (combining units 15) are just stacked. Further, the passage modules 7 ($7_1$, $7_2$ . . . $7_m$) can be easily produced from A1 plates, SUS plates or the like. The combining-dividing units 10 (combining units 15) are also easy to shape (machine). Thus, the production cost is low. Further, the accuracy of alignment of the passage modules 7 ($7_1$, $7_2$ . . . $7_m$) can be increased easily, and the assembling of the passage modules 7 ($7_1$, $7_2$ . . . $7_m$) is also easy. Also for this reason, the production cost can be decreased.

In the combining-dividing unit 10 (combining unit 15), the diameter of the inlets 11*a*, 11*b*, the diameter of the outlets 12*a*, 12*b*, the width of the channel 13 are approximately the same size. This helps prevent the micro-mixer from becoming clogged with a mixed liquid. Further, in the combining-dividing unit 10 (combining unit 15), the two inlets 11*a*, 11*b* are arranged symmetrically, the two outlets 12*a*, 12*b* are arranged symmetrically, and the direction in which the two inlets 11*a*, 11*b* are arranged and the direction in which the two outlets 12$a$, 12$b$ are arranged cross at right angles. This ensures symmetrical flows of fluids (liquids) (symmetrical laminar flow), effectively prevents fluids from flowing unevenly, and thereby increases the throughput satisfactorily. As a result, practically important advantages such that the mixing performance (mixing efficiency) increases satisfactorily, and that a micro-mixed liquid of high quality in which different kinds of liquids are mixed evenly can be easily produced can be obtained.

Figure 6:
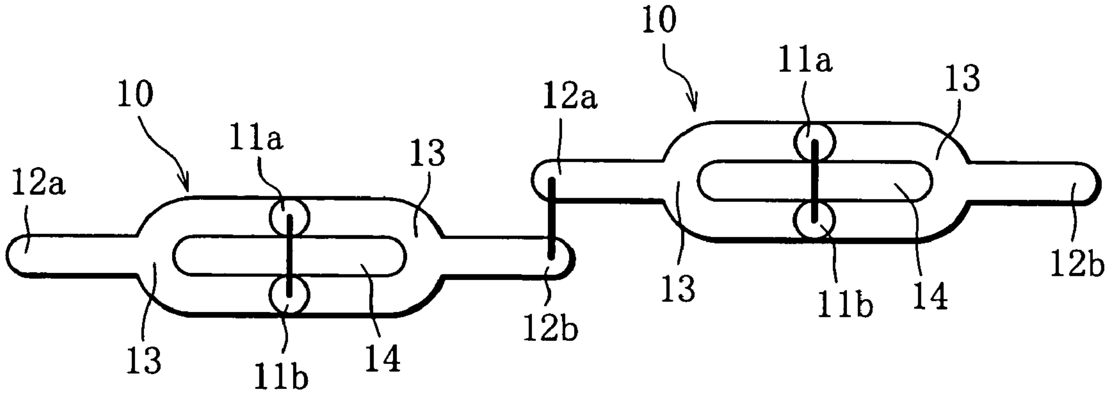
FIG. 6 is an illustration showing another example of a combining-dividing unit included in a passage module.
Figure 7:
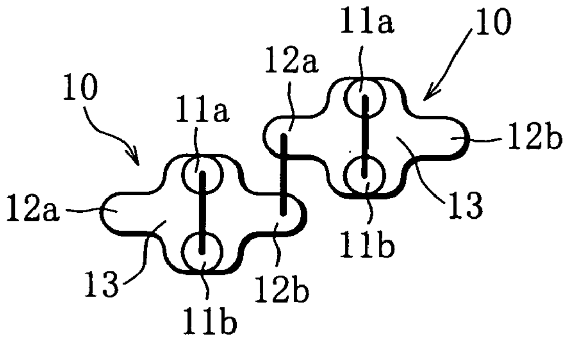
FIG. 7 is an illustration showing another example of a combining-dividing unit included in a passage module.
Figure 8:
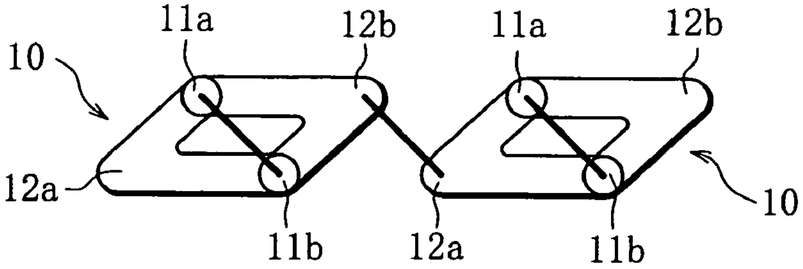
FIG. 8 is an illustration showing another example of a combining-dividing unit included in a passage module.

The combining-dividing unit 10 may have other shapes, for example, as shown in FIGS. 6 to 8. In the combining-dividing unit 10 shown in FIG. 6, two outlets 12$a$, 12$b$ have a longer distance between. The combining-dividing unit 10 shown in FIG. 7 does not have an island-like partition 14 for determining the direction of a channel 13, so that two outlets 12$a$, 12$b$ have a shorter distance between. In the combining-dividing unit 10 shown in FIG. 8, two inlets 11$a$, 11$b$ are arranged symmetrically relatively to an island-like partition 14 for determining the direction of a channel 13, two outlets 12$a$, 12$b$ are arranged symmetrically relatively to the partition 14, and the inlets 11$a$, 11$b$ and the outlets 12$a$, 12$b$ describe a parallelogram.

Also when the combining-dividing units 10 have any of these shapes, only if the combining-dividing units 10 are so arranged in each passage module 7 that the distance between the outlet 12$a$ of each combining-dividing unit 10 and the outlet 12$b$ of its adjacent combining-dividing unit 10 is equal to the distance between the two inlets 11$a$, 11$b$ of each combining-dividing unit 10, the inlets 11$a$, 11$b$ and the outlets 12$a$, 12$b$ can be aligned accurately in the stacked passage modules 7 ($7_1$, $7_2$ . . . $7_m$). Hence, effects similar to those obtained by the forgoing embodiment can be obtained.

Figure 9:
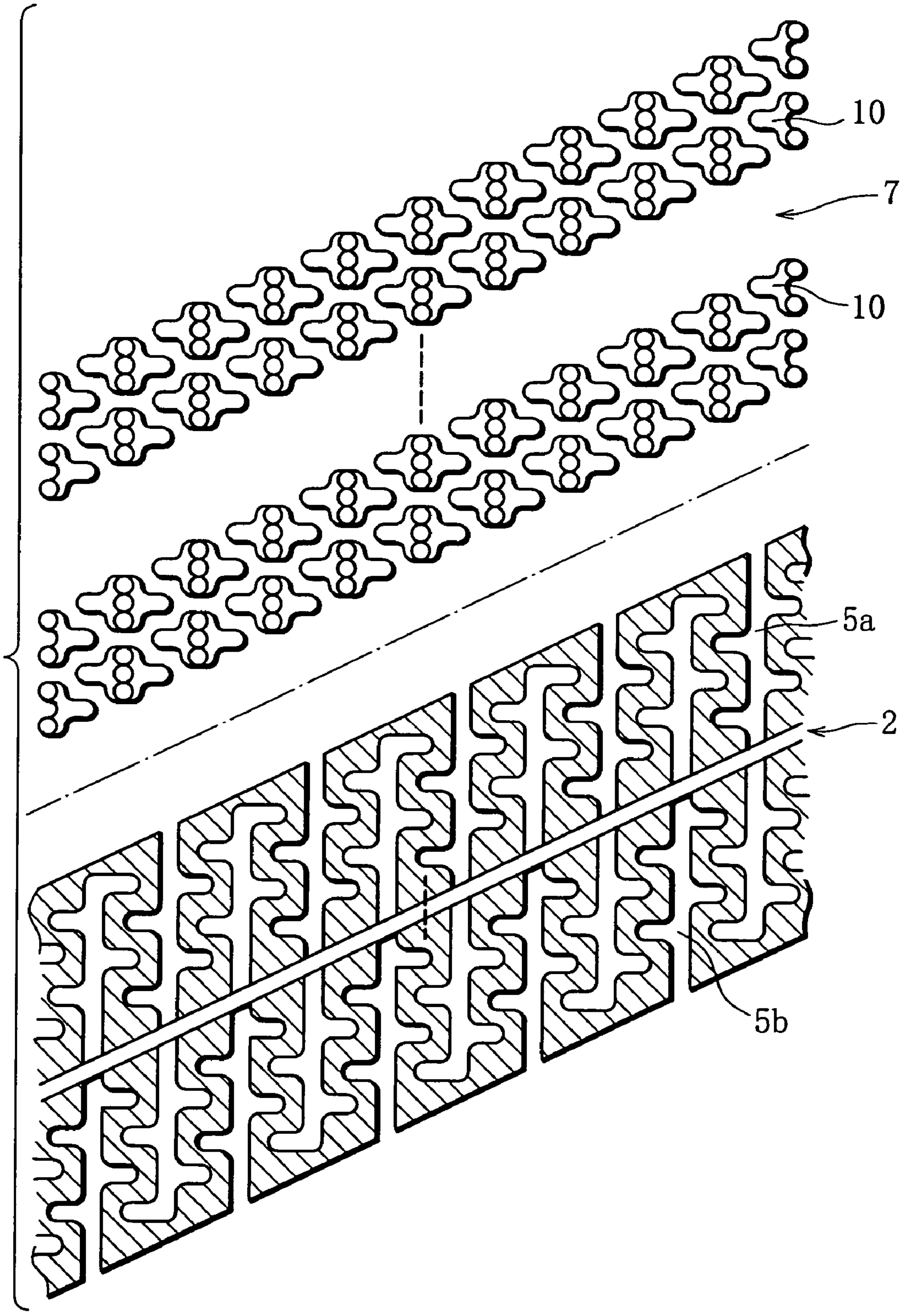
FIG. 9 is an illustration showing another example of arrangement of a plurality of combining-dividing units included in at passage modules.

In the foregoing embodiment, in each of the passage modules 7 ($7_1$, $7_2$ . . . $7_m$), a plurality of the combining-dividing units 10 (combining units 15) are arranged in a line. Alternatively, a plurality of the combining-dividing units 10 (combining units 15) may be arranged in a plurality of parallel lines, for example, as shown in FIG. 9. In this case, fluid flowing-in channels 5$a$, 5$b$ provided at the lower plate 2, which should correspond to the inlets 11$a$ and the inlets 11$b$ of the combining-dividing units 10 (combining units 15) in the most upstream passage module, respectively, can be arranged like teeth of a comb, as shown in FIG. 9.

Figure 10:
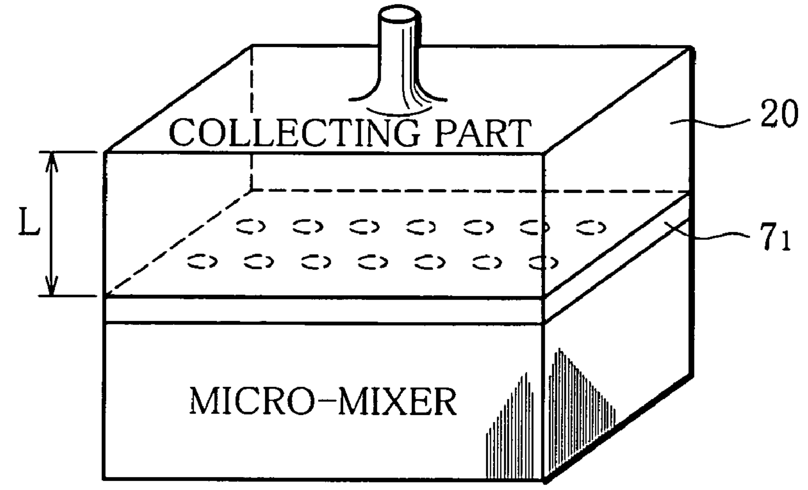
FIG. 10 is an illustration for explaining the structure and function of a collecting part provided at the most downstream passage module.

When, in each passage module, a plurality of the combining-dividing units 10 (combining units 15) are arranged in a plurality of lines as mentioned above, micro-mixed fluids flow from the most downstream (uppermost) passage module $7_1$, corresponding to those plurality of lines. Hence, it is desired, for example, as shown in FIG. 10, to provide a collecting part 20 on that surface of the most downstream (uppermost) passage module $7_1$ from which micro-mixed fluids flow out, to collect the micro-mixed fluids flowing from the outlets of the combining-dividing units 10 (combining units 15) and make them flow into a single passage. It is especially desirable that the collecting part 20 has a passage length L which can give time required for the micro-mixed fluids flowing from the outlets 12$a$ (12$b$) of the combining-dividing units to mix, or diffuse sufficiently. If the micro-mixture fluids should react, it is desirable that the collecting part 20 has a passage length L which can give enough time for the micro-mixture fluids to react.

The invention is not limited to the above-described embodiment. For example, each of the passage modules 7 may be so formed that one 12$a$ (12$b$) of the two outlets of the combining-dividing unit 10 arranged at one end of the line of the combining-dividing units 10 is extended up to the place close to the combining-dividing unit 10 arranged at the other end of the line, by means of a long channel. This allows the passage modules 7 to have the same number of the combining-dividing units 10.

Figure 11:
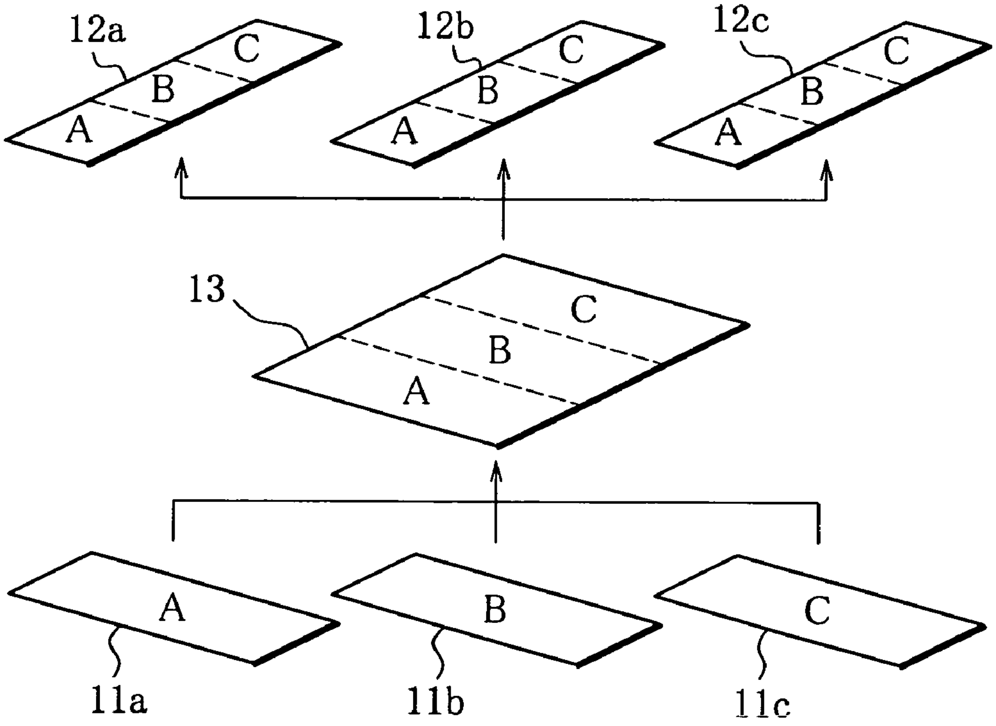
FIG. 11 is an illustration showing a functional structure of a combining-dividing unit having three inlets and three outlets.

While the foregoing embodiment was described using an example of a micromixer for mixing two kinds of fluids (liquids), the micromixer can be arranged for mixing three kinds of fluids (liquids). In this case, combining-dividing units 10 having three inlets 11$a$, 11$b$, 11$c$ and three outlets 12$a$, 12$b$ and 12$c$ are used, for example, as conceptually shown in FIG. 11. Here, each combining-dividing unit 10 receives three kinds of fluids (liquids) A, B, C through its three inlets 11$a$, 11$b$, 11$c$, and combines them to form a three-layer laminar flow (A+B+C) at the channel 13. Then, the combining-dividing unit 10 divides the resulting mixed fluid, namely the threelayer laminar flow (A+B+C) into three flows at right angles with the direction of the laminar flow, and makes them flow out through its three outlets 12$a$, 12$b$, 12$c$ as three separate fluids (A+B+C)/3.

Figure 12:
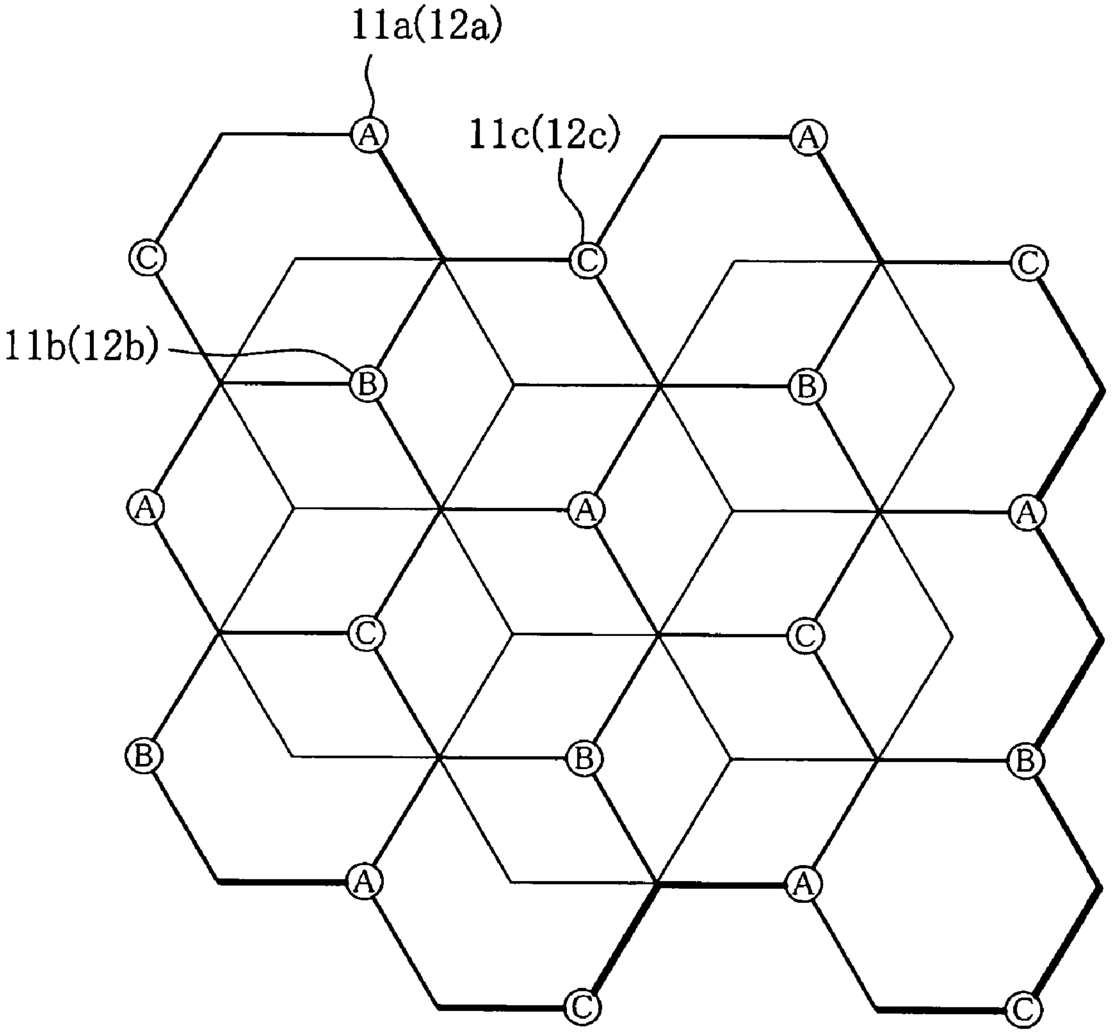
FIG. 12 is an illustration showing an arrangement of a plurality of the combining-dividing units having three inlets and three outlets shown in FIG. 11.

In this case, for example, as shown in FIG. 12, a plurality of combining-dividing unit 10 are arranged in a honeycomb structure by placing the three inlets 11$a$, 11$b$, 11$c$ (three outlets 12$a$, 12$b$, 12$c$) of each combining-dividing unit at every second vertex of a hexagon, and the inlets 11$a$, 11$b$, 11$c$ of each of the combining-dividing unit 10 in each of the passage modules 7 are connected with an outlet 12$a$ of a combining-dividing unit 10, an outlet 12$b$ of another combining-dividing unit 10, and an outlet 12$c$ of further another combining-dividing unit 10 in its adjacent passage module, respectively.

Likewise, when the micro-mixer is arranged for mixing four kinds of fluids (liquids), combining-dividing units 10 having four inlets and four outlets are used. In this case, channels connecting the four inlets and four outlets need to be crossed. Hence, each passage module itself has a multi-tiered structure, and the channels are each provided in a different tier.

While the micro-mixing where two kinds of fluids are mixed finely was described in the above, the invention can be also applied to produce emulsion in which a liquid is diffused in another insoluble liquid in the form of fine particles. Other various modifications can be made without departing from the scope of the invention.

INDUSTRIAL APPLICABILITY

As explained above, the micro-mixer according to the invention comprises a plurality of passage modules stacked in a multi-tiered structure, each of the passage modules has a plurality of combining-dividing units arranged in a predetermined arrangement, and each of the combining-dividing units has m number of inlets and m number of outlets, where the inlets and the outlets in the stacked passage modules are connected in order, according to a predetermined pattern. Thus, the micro-mixer has a simple structure, and can be produced easily at low cost. Further, the accuracy of alignment can be easily increased sufficiently, and the throughput increases sufficiently due to the symmetrical structure of the passage. As a result, the invention provides practically important advantages such that the mixing performance (mixing efficiency) increases satisfactorily, and that a micro-mixed liquid of high quality in which different liquids are mixed evenly can be easily and quickly produced.

The invention claimed is:

1. A micro-mixer, comprising:

a plurality of passage modules stacked so as to form a multi-tiered flow passage, wherein each passage module of a plurality of said passage modules includes a plurality of combining-dividing units arranged at regular intervals;

wherein each of said combining-dividing units includes n number of inlets formed in an upstream surface of the passage module, n number of outlets formed in a downstream surface of the passage module, and a channel connecting said n number of inlets and said n number of outlets, wherein n is at least 2;

wherein each of said n number of outlets of each of said combining-dividing units in each of said stacked passage modules is connected with an inlet of a respective different combining-dividing unit in an immediately downstream passage module; and wherein, in each of the combining-dividing units, a flow of a fluid introduced through each of the n number of inlets is divided into n number of partial flows, and a partial flow from each of the n number of inlets is guided to each of the n number of outlets, such that each of the n number of outlets outputs a combined flow including n number of the partial flows taken respectively from the n number of inlets.

2. The micro-mixer according to claim 1, wherein n is in a range of 2 to 4.

3. The micro-mixer according to claim 1, wherein n is 2, and the combining-dividing units of each of said plurality of passage modules are arranged such that a distance between two adjacent outlets of two adjacent combining-dividing units is equal to a distance between the two inlets of each combining-dividing unit.

4. The micro-mixer according to claim 3, wherein said plurality of combining-dividing units of each of said plurality of passage modules are arranged in a line.

5. The micro-miser according to claim 1, wherein in each of said plurality of combining-dividing units, said n number of inlets and said n number of outlets have an approximately equal diameter, and said channel has a width and a depth which are approximately equal to said diameter.

6. The micro-mixer according to claim 1, wherein in said plurality of passage modules, a most downstream passage module is coupled to a collecting part for collecting fluid flowing from the most downstream passage module and making the fluid into a single passage, and wherein said collecting part has a passage length which allows the collected fluid to mix.

7. A micromixer, comprising:

a plurality of plate-like passage modules which are stacked;

wherein each of said passage modules includes at least one combining-dividing unit and/or at least one combining unit, said combining-dividing unit having two inlets and two outlets connected by a channel, and said combining unit having two inlets and one outlet connected by a channel, wherein the two inlets of each of said at least one combining-dividing unit and/or at least one combining unit in each of said stacked passage modules are each connected with an outlet of a different one of two of said at least one combining-dividing unit and/or at least one combining unit in an immediately downstream passage module, and wherein in said stacked passage modules, a total number of said at least one combining-dividing unit and/or at least one combining unit included in each passage module is decreased one by one from a most upstream passage module to tire a most downstream passage module so as to mix fluids flowing through said stacked passage modules and such that the mixed fluids flow out into a single passage.

8. The micro-mixer according to claim 7, wherein said combining-dividing unit has a structure in which an island-like partition for determining a direction of said channel is provided at a center portion of the combining-dividing unit, said two inlets are arranged symmetrically relatively to said partition, said two outlets are arranged symmetrically relatively to said partition, and a direction in which said two inlets are arranged and a direction in which said two outlets are arranged cross at right angles, and wherein said combining unit has a structure obtained by omitting one of said two outlets of the combining-dividing unit and a part of the channel which extends to said omitted outlet.

* * * * *